(12) United States Patent  (10) Patent No.: US 8,008,188 B2
Olson et al.  (45) Date of Patent: Aug. 30, 2011

(54) METHOD OF FORMING SOLID BLIND VIAS THROUGH THE DIELECTRIC COATING ON HIGH DENSITY INTERCONNECT SUBSTRATE MATERIALS

(75) Inventors: Kevin C. Olson, Wexford, PA (US); Alan E. Wang, Shanghai (CN)

(73) Assignee: PPG Industries Ohio, Inc., Cleveland, OH (US)

( * ) Notice: Subject to any disclaimer, the term of this patent is extended or adjusted under 35 U.S.C. 154(b) by 1114 days.

(21) Appl. No.: 11/760,804

(22) Filed: Jun. 11, 2007

(65) Prior Publication Data

US 2008/0305626 A1 Dec. 11, 2008

(51) Int. Cl.
*H01L 21/4763* (2006.01)

(52) U.S. Cl. . 438/637; 438/618; 438/678; 257/E21.006; 257/E21.007; 257/E21.027; 257/E21.058; 257/E21.077; 257/E21.17; 257/E21.32; 257/E21.134; 257/E21.231; 257/E21.267; 257/E21.278; 257/E21.293; 257/E21.329; 257/E21.347

(58) Field of Classification Search ............ 438/637, 438/618, 311, 308, 722, 723, 724, 678, 687, 438/688, 663, 781, 782, 681, 942; 257/E21.006, 257/7, 27, 58, 77, 32, 134, 231, 267, 278, 257/293, 329, 347

See application file for complete search history.

(56) References Cited

U.S. PATENT DOCUMENTS

| | | | |
|---|---|---|---|
| 4,840,923 A | 6/1989 | Flagello et al. | |
| 5,148,265 A * | 9/1992 | Khandros et al. | 257/773 |
| 5,558,928 A * | 9/1996 | DiStefano et al. | 428/209 |
| 6,266,874 B1 | 7/2001 | DiStefano et al. | |
| 6,428,942 B1 | 8/2002 | Jiang et al. | |
| 6,492,201 B1 * | 12/2002 | Haba | 438/121 |
| 6,671,950 B2 | 1/2004 | Sturni et al. | |
| 6,713,587 B2 | 3/2004 | McCollum et al. | |
| 6,824,959 B2 | 11/2004 | Olson et al. | |
| 6,951,707 B2 | 10/2005 | Wang et al. | |
| 7,000,313 B2 | 2/2006 | McCollum et al. | |
| 7,094,676 B1 | 8/2006 | Leu et al. | |
| 2002/0124398 A1 | 9/2002 | Sturni et al. | |
| 2002/0125040 A1 | 9/2002 | Sturni et al. | |
| 2002/0127494 A1 | 9/2002 | Sturni et al. | |
| 2003/0140490 A1 | 7/2003 | Olson et al. | |
| 2004/0140616 A1 * | 7/2004 | Davis | 273/292 |
| 2005/0124196 A1 | 6/2005 | Olson et al. | |
| 2006/0141143 A1 | 6/2006 | McCollum et al. | |

FOREIGN PATENT DOCUMENTS

| | | |
|---|---|---|
| WO | 96/02959 | 2/1996 |
| WO | 2004/004428 | 1/2004 |
| WO | 2004/045262 | 5/2004 |

* cited by examiner

*Primary Examiner* — David Nhu

(74) *Attorney, Agent, or Firm* — Robert P. Lenart

(57) ABSTRACT

A method is provided comprising: coating an electrically conductive core with a first removable material, creating openings in the first removable material to expose portions of the electrically conductive core, plating a conductive material onto the exposed portions of the electrically conductive core, coating the conductive material with a second removable material, removing the first removable material, electrophoretically coating the electrically conductive core with a dielectric coating, and removing the second removable material.

16 Claims, 4 Drawing Sheets

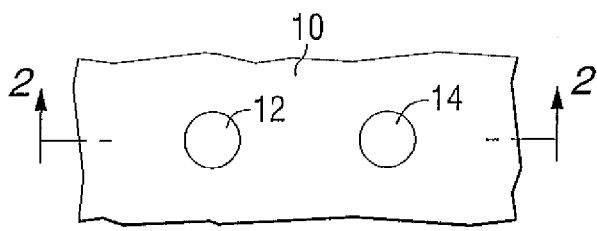
FIG. 1   FIG. 2
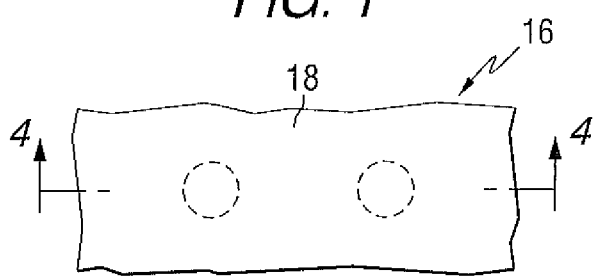
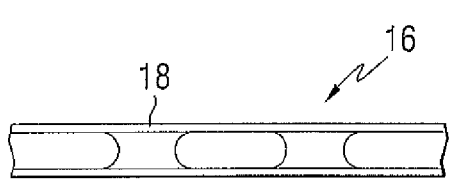
FIG. 3   FIG. 4
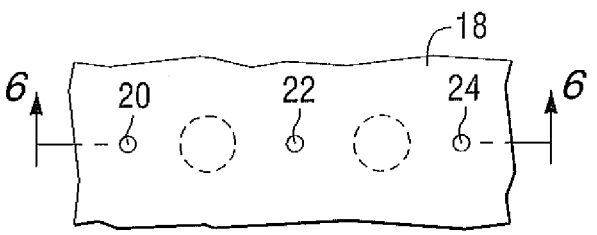
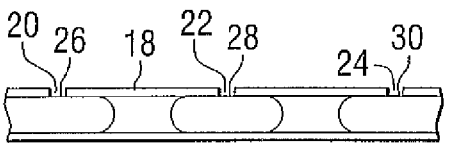
FIG. 5   FIG. 6
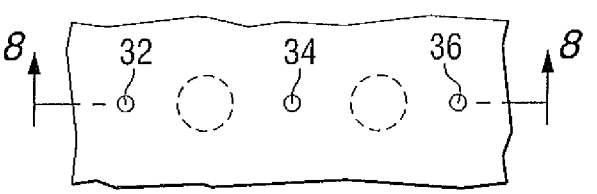
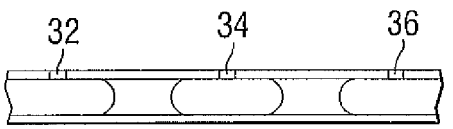
FIG. 7   FIG. 8
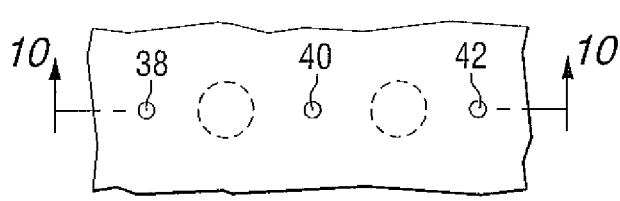
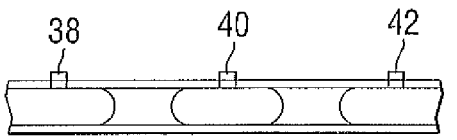
FIG. 9   FIG. 10

METHOD OF FORMING SOLID BLIND VIAS THROUGH THE DIELECTRIC COATING ON HIGH DENSITY INTERCONNECT SUBSTRATE MATERIALS

FIELD OF THE INVENTION

The present invention relates to electronic circuit assemblies, and more particularly, to circuit assemblies including high density interconnect (HDI) substrates, and the fabrication thereof.

BACKGROUND OF THE INVENTION

Electrical components, for example, resistors, transistors, and capacitors, are commonly mounted on circuit panel structures such as printed circuit boards. Circuit boards ordinarily include a generally flat sheet of dielectric material with electrical conductors disposed on a major flat surface of the sheet, or on both major surfaces. The conductors are commonly formed from metallic materials such as copper and serve to interconnect the electrical components mounted to the board.

Microelectronic circuit packages are prepared in various sizes. One packaging level includes semiconductor chips containing multiple microcircuits and/or other components. Such chips are usually made from semiconductors such as silicon, and the like. Intermediate package levels, also called chip scale packages (CSP) may include multi-layer substrates and a plurality of chips. These intermediate package levels can be attached to larger scale circuit cards, motherboards, and the like. The intermediate package levels serve several purposes in the overall circuit assembly including structural support, transitional integration of the smaller scale circuits to larger scale boards, and the dissipation of heat from the circuit components. Substrates used in conventional intermediate package levels have included a variety of materials, for example, ceramics, fiberglass reinforced polyepoxides, and polyimides.

There has been an increasing need for circuit panel structures, which provide high density, complex interconnections. Such a need can be addressed by multi-layer circuit panel structures; however, the fabrication of such multi-layer circuit assemblies has presented serious drawbacks. It is difficult to align holes and vias by drilling the dielectric layers as increasing layers of circuitry are applied. Laser drilling is the most common method for forming vias, which can add significant cost to manufacture such circuit assemblies.

Generally multi-layer panels are made by providing individual, dual sided circuit panels with appropriate conductors thereon. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes typically are drilled through the stack at locations where electrical connections between different boards are desired. The resulting holes or "through vias" are then coated or filled with electrically conductive materials usually by plating the interiors of the holes to form a plated through via. It is difficult to drill holes with a high ratio of depth to diameter, thus the holes used in such assemblies must be relatively large and consume a great deal of space in the assembly.

In applications wherein circuit layers are built one on top of another, a dielectric material typically separates the circuitized layers. Polymeric dielectric materials that typically are used in circuit assembly, are thermoplastic or thermoset polymers. Thermoset materials are typically cured first to form a conformal coating. Although the conformally coated substrate may contain through holes conforming to a perforate substrate, blind vias are typically formed by drilling, such as by a laser.

It would be desirable to provide a method of forming solid blind vias or raised conductive structures in substrates using fabrication techniques that reduce the costs of via formation compared to mechanical and laser drilling techniques.

SUMMARY OF THE INVENTION

In a first aspect, the invention provides a method comprising: coating an electrically conductive core with a first removable material, creating openings in the first removable material to expose portions of the electrically conductive core, plating a conductive material onto the exposed portions of the electrically conductive core, coating portions of the plated, conductive material with a second removable material, removing the first removable material, electrophoretically coating the electrically conductive core with a dielectric coating, and removing the second removable material.

In another aspect, the invention provides a method comprising: applying a layer of a first conductive material to a substrate having a dielectric coating on a conductive core and conductive vias extending through openings in the dielectric coating, applying a layer of a first removable material to the first conductive material, forming openings in the first removable material to expose areas of the conductive material to be plated, plating a second conductive material onto the exposed areas of the first conductive material, applying a layer of a second removable material to the first and second conductive material, forming openings in the second removable material to expose areas of the second conductive material to be plated, and plating a third conductive material onto the exposed areas of the first conductive material.

In another aspect, the invention provides a method comprising: forming a first substrate by (a) applying an electrodepositable dielectric coating onto a conductive surface, (b) curing the dielectric coating, (c) depositing an adhesion layer and a seed layer onto the dielectric coating, (d) applying a layer of a first removable material to the seed layer, (e) forming openings in the first removable material to expose areas of the seed layer, (f) electroplating a first conductive material to the exposed areas of the seed layer, (g) applying a layer of a second removable material, (h) forming openings in the second removable material to expose areas of the first conductive material, (i) plating a second conductive material to the exposed areas of the first conductive material, (j) removing the first and second removable materials, (k) removing unplated portions of the seed layer, repeating steps (a) through (k) to form a second substrate, and laminating the first and second substrates together with a layer of dielectric material between the first and second substrates, forming at least one interconnect between the first and second substrates.

In another aspect, the invention provides a method comprising: applying a layer of a first conductive material to a substrate having a dielectric coating on a conductive core and conductive vias extending through openings in the dielectric coating, plating and patterning the first conductive material, forming a circuitry layer, applying a layer of plating resist on the just patterned circuitry layer, forming openings in the plating resist to expose areas of the patterned circuitry layer to be plated, plating a second conductive material onto the exposed areas of the first conductive material, and removing plating resist.

BRIEF DESCRIPTION OF THE DRAWINGS

FIG. 1 is a plan view of a core layer of a substrate.

FIG. 2 is a cross-sectional view of the core layer of FIG. 1, taken along line 2-2.

FIG. 3 is a plan view of an intermediate structure.

FIG. 4 is a cross-sectional view of the intermediate structure of FIG. 3, taken along line 4-4.

FIG. 5 is a plan view of an intermediate structure.

FIG. 6 is a cross-sectional view of the intermediate structure of FIG. 5, taken along line 6-6.

FIG. 7 is a plan view of an intermediate structure.

FIG. 8 is a cross-sectional view of the intermediate structure of FIG. 7, taken along line 8-8.

FIG. 9 is a plan view of an intermediate structure.

FIG. 10 is a cross-sectional view of the intermediate structure of FIG. 9, taken along line 10-10.

DETAILED DESCRIPTION OF THE INVENTION

Figure 11:
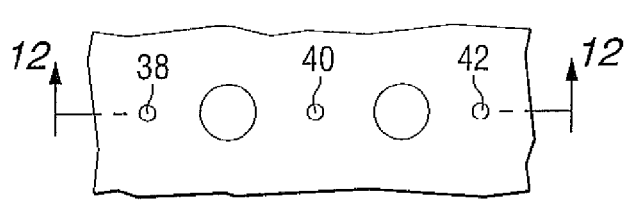
FIG. 11 is a plan view of an intermediate structure.

In one aspect, this invention provides a method of producing conductive raised features, such as solid blind vias or posts, that extend through a dielectric coating of a circuit board or substrate, that may be used as a component of a chip scale package (CSP) or as a high density interconnect (HDI) substrate.

Referring to the drawings, FIG. 1 is a plan view of a sheet 10 of conductive material that can be used to form a conductive core of a substrate or circuit board, and FIG. 2 is a cross-sectional view of the core of FIG. 1, taken along line 2-2. Optional openings, or vias, 12 and 14 can be provided in the core.

The core can be a conductive material such as a nickel-iron alloy. A preferred nickel-iron alloy is INVAR, (trademark owned by Imphy S. A., 168 Rue de Rivoli, Paris, France) comprising approximately 64 weight percent iron and 36 weight percent nickel. This alloy has a low coefficient of thermal expansion, comparable to that of silicon materials used to prepare chips. A low coefficient of thermal expansion is desirable in order to prevent failure of adhesive joints between successively larger or smaller scale layers of a circuit board or a chip scale package, due to thermal cycling in storage or normal use. When a nickel-iron alloy is used as the electrically conductive core, a layer of copper metal can be applied to all surfaces of the electrically conductive core to form a Cu/Invar/Cu structure having increased conductivity. The layer of copper metal may be applied by conventional means, such as electroplating or metal vapor deposition. The layer of copper typically can have a thickness of from 1 to 20 microns.

In other embodiments, the substrate core layer can comprise any of a variety of materials, such as a metal, which may be for example, untreated or galvanized steel, aluminum, gold, nickel, copper, magnesium or alloys of any of the foregoing metals, as well as conductive carbon coated materials or metallized non-conductive materials, such as sputtered ceramic or coated plastic. More particularly, the substrate can comprise a metal core selected from copper foil, nickel-iron alloys, and combinations thereof. The substrate can also be a perforate substrate comprised of any of the previously mentioned metals or combinations thereof.

In some embodiments, the electrically conductive core can have a thickness of about 20 to 400 microns, and preferably 150 to 250 microns. The core can include a plurality of holes, which may or may not have a uniform size and shape. In one embodiment, when the holes are circular, the diameter of the holes can be about 8 mil (203.2 microns). The holes may be larger or smaller as desired.

A layer of a first removable material, which can be a resist (also referred to as a plating resist) is applied to the core. This is illustrated in FIGS. 3 and 4, wherein FIG. 3 is a plan view of an intermediate structure 16 of a substrate, including the core 10 that is coated with a plating resist 18, and FIG. 4 is a cross-sectional view of the intermediate structure of FIG. 3, taken along line 4-4. The plating resist can be patterned using known techniques to create openings in the plating resist and to expose portions of the conductive metal core where blind via studs and other raised features are planned as shown in FIGS. 5 and 6. For example, the plating resist can be imaged and developed to produce one or more openings 20, 22 and 24 in the plating resist and to expose one or more portions 26, 28 and 30 of a surface of the conductive core where blind vias, conductive studs, or other raised features are desired.

The plating resist can be a negative-acting photosensitive resist that is developable and strippable in a caustic solution, or a positive-acting photoresist that is developable and strippable in an acidic solution. In the example of FIG. 4, a laminated plating resist is used. The laminated plating resist tents over the openings. Other types of removable coatings, which might fill the holes or coat the walls of the holes, can also be used.

Negative-acting photoresists include liquid or dry-film type compositions. Liquid compositions may be applied by rolling application techniques, curtain application, or electrodeposition. Preferably, liquid photoresists are applied by electrodeposition, more preferably cationic electrodeposition. Electrodepositable compositions comprise an ionic, polymeric material, which may be cationic or anionic, and may be selected from polyesters, polyurethanes, acrylics, and polyepoxides.

If the first removable material is a photosensitive material, after the photosensitive layer is applied, a photo-mask having a desired pattern may be placed over the photosensitive layer and the layered substrate exposed to a sufficient level of a suitable actinic radiation source. As used herein, the term "sufficient level of actinic radiation" refers to that level of radiation which polymerizes the monomers in the radiation-exposed areas in the case of negative-acting resists, or which depolymerizes the polymer or renders the polymer more soluble in the case of positive-acting resists. This results in a solubility differential between the radiation-exposed and radiation-shielded areas.

The photo-mask may be removed after exposure to the radiation source and the layered substrate developed using conventional developing solutions to remove more soluble portions of the photosensitive layer, and uncover selected areas of the underlying metal layer. The metal, which is uncovered during this step, may then be etched using metal etchants that convert the metal to water-soluble metal complexes. The soluble complexes may be removed by water spraying.

As shown in FIGS. 7 and 8, the substrate is then electroplated with a conductive material such as copper. Thus conductive material will be deposited in the openings in the plating resist, and on the exposed areas of the conductive substrate, resulting in the formation of conductive raised features, such as posts or studs 32, 34 and 36 at the exposed area positions. To perform the plating, the substrate can be immersed in a plating bath and a voltage applied between the core and the bath. Since the plating resist is non-conductive, plating only occurs where there are openings in the plating resist.

After electroplating and formation of the studs, a second removable material 38, 40 and 42 is applied. The second removable material is formed on the tops of the raised features, as shown in FIGS. 9 and 10. The second removable material can be an electrodepositable photoresist. The electrodepositable photoresist would only be applied to the areas of the structure that have exposed metal, i.e., studs or posts that were formed during the plating step. In one embodiment, the electrodepositable photoresist is positive-acting, cationic photoresist, and is developable and strippable in an acidic solution. The electrodepositable photoresist can also be a negative-acting photoresist, that is developable and strippable in a caustic solution.

Suitable positive-acting photosensitive resins include any of those known to practitioners skilled in the art. Examples include dinitro-benzyl functional polymers. Such resins have a high degree of photosensitivity. In one example, the resinous photosensitive layer is a composition comprising a dinitro-benzyl functional polymer, typically applied by spraying. Nitrobenzyl functional polymers are also suitable. The photosensitive layer can also be an electrodepositable composition comprising a dinitrobenzyl functional polyurethane and an epoxy-amine polymer. Since the areas covered by the electrodepositable photoresist in this example need not be exposed to resolve the desired features, the coating need not be a resist, but only a removable coating.

Figure 12:
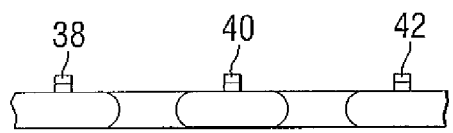
FIG. 12 is a cross-sectional view of the intermediate structure of FIG. 11, taken along line 12-12.

Then the first removable material is removed. If the first removable material is a photoresist, the substrate can be exposed to ultraviolet (UV) radiation to photo-degrade or depolymerize the photoresist covering the tops of the posts or studs, as shown in FIGS. 11 and 12. Alternatively, since the photoresist could be replaced by another type of removable material, the step of exposing the photoresist can be eliminated.

By using different materials for the first and second removable materials, those materials can be removed using different chemistries. Thus the second removable material 38, 40 and 42 is left intact on top of the studs or posts.

Figure 13:
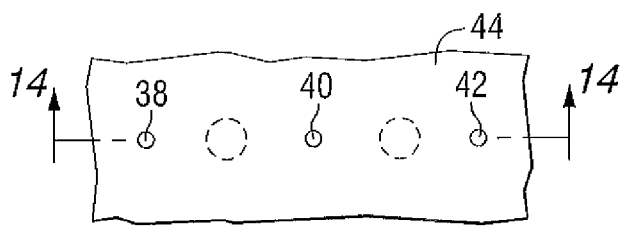
FIG. 13 is a plan view of an intermediate structure.
Figure 14:
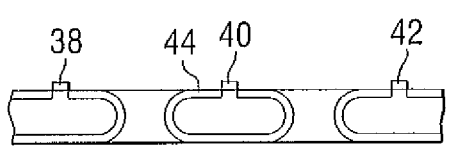
FIG. 14 is a cross-sectional view of the intermediate structure of FIG. 13, taken along line 14-14.

A dielectric coating 44 is then applied electrophoretically to conformally coat the conductive substrate except in those areas covered by second removable material that remains on the tops of the posts, studs or other features, as shown in FIGS. 13 and 14. Only the areas with exposed metal are coated with the dielectric material. The tops of the studs or posts are still covered with electrodepositable photoresist (or other removable coating) and thus do not get coated with dielectric material. If the step of exposing the photoresist is performed, it could be done before or after the application and curing of the dielectric material.

The dielectric coating is applied to the exposed surfaces of the core to form a conformal coating thereon. As used herein, a "conformal" film or coating refers to a film or coating having a substantially uniform thickness, which conforms to the core topography, including the surfaces within (but, preferably, not occluding) holes in the core. The dielectric coating film thickness is typically between 5 and 50 microns. A lower film thickness may be desirable for a variety of reasons. For example, a dielectric coating having a low film thickness may allow for smaller scale circuitry. However, the dielectric coating thickness can be determined by the performance requirements of the completed substrate.

The dielectric material is a non-conducting substance or insulator. A material having a low dielectric constant is desired for high-frequency, high-speed digital applications where the capacitances of substrates and coatings are critical to the reliable functioning of circuits.

The dielectric coating can be formed from any of a variety of coating compositions. The dielectric coating can be formed from a thermoplastic composition where, once applied, solvents (i.e., organic solvents and/or water) are driven off or evaporated, thereby forming a film of the dielectric coating on the substrate. The dielectric coating also can be formed from a curable or thermosetting composition where once the composition is applied to the substrate and cured, a cured film of the dielectric coating is formed. The dielectric coating can be applied by any coating application technique to provide a coating having a desired dielectric constant to ensure sufficient insulating properties, and flame resistance properties.

The dielectric coating may be applied by any suitable conformal coating method including, for example, dip coating, vapor deposition, electrodeposition and autophoresis. Examples of dielectric coatings applied by vapor deposition include poly-(para-xylylenes), encompassing both substituted and unsubstituted poly-(para-xylylene); silsesquioxanes; and poly-benzocyclobutene. Examples of dielectric coatings applied by electrodeposition include anodic and cathodic acrylic, epoxy, polyester, polyurethane, polyimide or oleoresinous compositions. The use of an electrodeposited coating takes advantage of the fact that the tops of the vias/studs are sufficiently insulated from the application of the electrodeposited dielectric coating.

In a particular embodiment, the dielectric coating can be formed by the electrodeposition of an electrodepositable photosensitive material. In that embodiment, the dielectric coating would be applied to the core by electrodeposition of an electrodepositable coating composition comprising a resinous phase dispersed in an aqueous medium, where the resinous phase has a covalently bonded halogen content of at least 1 percent by weight based on total weight of resin solids present in said resinous phase. In another embodiment, a non-photosensitive dielectric material can be used.

The electrodepositable coating compositions can be electrophoretically applied to an electroconductive substrate (or substrate that has been rendered electroconductive as by metallization). The applied voltage for electrodeposition may be varied and can be, for example, as low as 1 volt to as high as several thousand volts, but typically between 50 and 500 volts. The current density is usually between 0.5 ampere and 5 amperes per square foot (0.5 to 5 milliamperes per square centimeter) and tends to decrease during electrodeposition indicating the formation of an insulating conformal film on all exposed surfaces of the substrate. After the coating has been applied by electrodeposition, it typically is cured, usually thermally cured at elevated temperatures ranging from 90° to 300° C. for a period of 1 to 40 minutes to form a conformal dielectric coating over all exposed surfaces of the core.

After application of the dielectric coating, the dielectric coating can be removed in one or more predetermined locations to expose one or more sections of the substrate surface. The dielectric coating can be removed by a variety of methods, for example by ablation techniques. Such ablation typically is performed using a laser or by other conventional techniques, for example, mechanical drilling and chemical or plasma etching techniques. If a photosensitive dielectric coating were used, it could be exposed and developed to form the openings.

Also, prior to application of the dielectric coating, the substrate surface may be pretreated or otherwise prepared for the application of the dielectric material. For example, cleaning, rinsing, and/or treatment with an adhesion promoter prior to application of the dielectric material may be appropriate.

Figure 15:
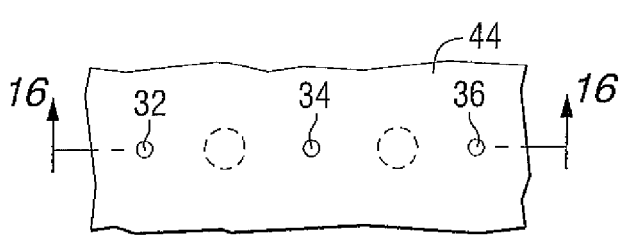
FIG. 15 is a plan view of a substrate.
Figure 16:
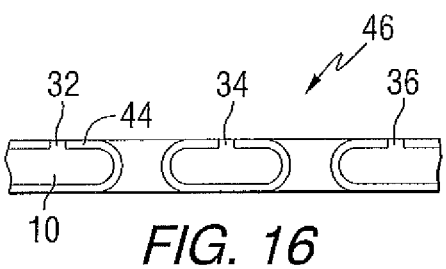
FIG. 16 is a cross-sectional view of the substrate of FIG. 15, taken along line 16-16.

Finally, as shown in FIGS. 15 and 16, the second removable material (that can be a photoresist) is removed, leaving the completed substrate 46. To obtain the structure of FIGS. 15 and 16, the dielectric coating is cured or partially cured (if needed) and the remaining photoresist (or other removable coating) 38, 40 and 42 is removed. At this point, the substrate is ready for future processing such as sputtering, plating and etching. The end result is a conformally coated substrate with one or more solid vias extending through the dielectric material 44 to the metal core 10.

The process described above can be repeated multiple times for each layer of a multiple layer substrate or circuit board. A final multi-layered board could include the posts, studs or other raised features for making connections from the outermost layer, to an inner layer, from an inner layer to another inner layer, from an inner layer to the core, and/or from the outermost layer to the core.

The thickness of the removable material layers would be chosen such that it corresponds to the desired height of the plated posts and/or studs, as well as a desired dielectric thickness.

The solid posts, studs or other raised features could serve as blind microvias, allowing for electrical connections through the dielectric layer. The posts could also be used for the positioning and anchoring of boards for lamination into multi-layer packages. Additionally, the posts, studs and other raised features can serve as thermal conductors, transferring heat from chips or other components to the exterior of the package.

In another aspect, the invention provides a method for making multi-layer substrates, chip scale packages, or other circuit assemblies, using a multi-layer build-up process with pad-to-pad connections. In this aspect, the invention provides a process for joining multiple layers of substrate and making electrical connections between the joined layers.

In one embodiment, the method begins by coating a substrate having a solid metal via with a thin layer of conductive material (such as sputtered and/or electroplated copper). Next, a layer of a first removable material is applied to all areas. Preferably, the first removable material is an electrodepositable resist. If the removable material is a plating resist, it is imaged and developed in the areas to be plated. Then a conductive material such as copper is electroplated to the desired thickness, preferably to the thickness of the plating resist. Next, a layer of a second removable material is applied. If the second removable material is a plating resist, it is imaged and developed, exposing only the areas for solid via studs and posts. Copper is again electroplated to the desired thickness, preferably to the thickness of the second layer of plating resist. Thus solid blind via studs and posts are formed. Then, all of the plating resist is removed. This process is described in more detail with reference to FIGS. 17-34.

Figure 17:
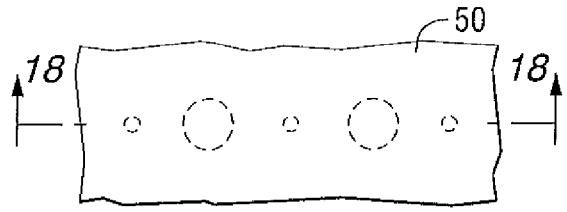
FIG. 17 is a plan view of an intermediate structure.
Figure 18:
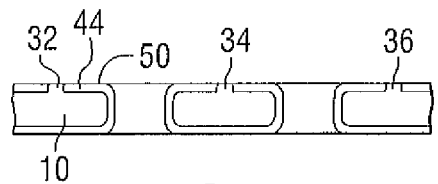
FIG. 18 is a cross-sectional view of the intermediate structure of FIG. 17, taken along line 18-18.

Beginning with the substrate of FIGS. 15 and 16, a thin layer of metal 50, such as copper, is applied to the dielectric coating 44 on the core 10, as shown in FIGS. 17 and 18. The copper can be deposited by initially using electroless deposition (i.e., deposition of metal by chemical means instead of by electrodeposition) and then plating additional metal to achieve the desired thickness. Alternatively, the coated substrate can be sputtered with a seed layer (also called a tie-layer) of metal such as chromium or nickel, followed by a layer of sputtered copper, and then copper plated to the desired thickness.

Figure 19:
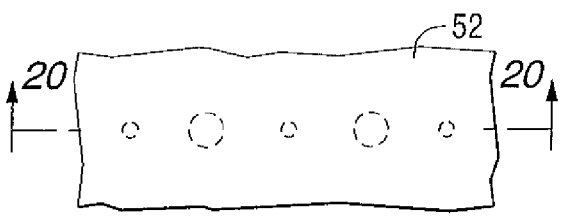
FIG. 19 is a plan view of an intermediate structure.
Figure 20:
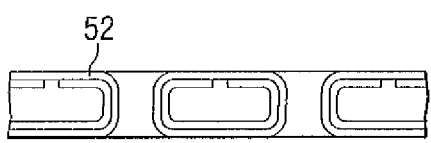
FIG. 20 is a cross-sectional view of the intermediate structure of FIG. 19, taken along line 20-20.
Figure 21:
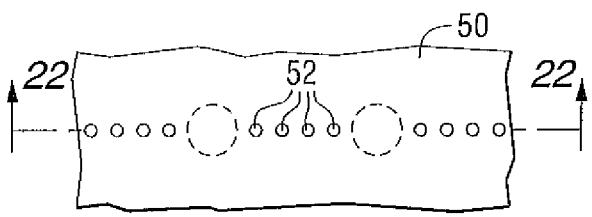
FIG. 21 is a plan view of an intermediate structure.
Figure 22:
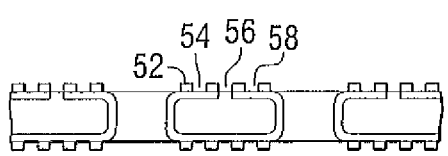
FIG. 22 is a cross-sectional view of the intermediate structure of FIG. 21, taken along line 22-22.

The substrate with the thin layer of copper can then be coated with a conventional plating resist 52, as shown in FIGS. 19 and 20. As shown in FIGS. 21 and 22, the resist 52 can be patterned using known techniques to expose areas 54, 56 and 58, where vias, blind vias, other raised structures, and/or electrical circuitry are planned.

Figure 23:
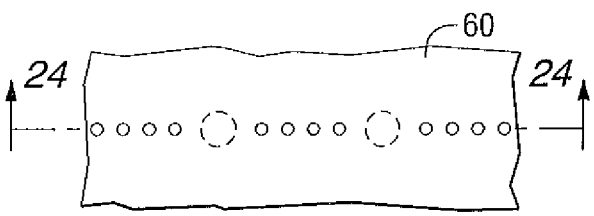
FIG. 23 is a plan view of an intermediate structure.
Figure 24:
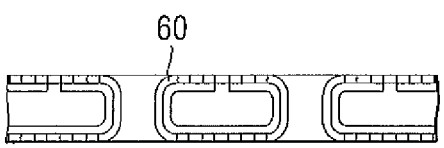
FIG. 24 is a cross-sectional view of the intermediate structure of FIG. 23, taken along line 24-24.
Figure 25:
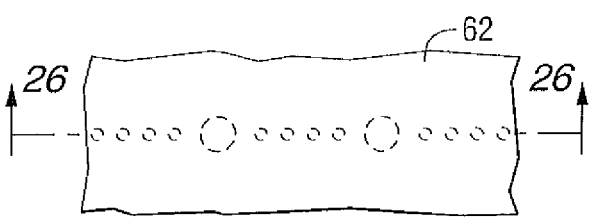
FIG. 25 is a plan view of an intermediate structure.
Figure 26:
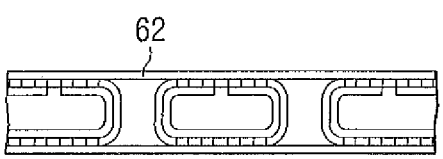
FIG. 26 is a cross-sectional view of the intermediate structure of FIG. 25, taken along line 26-26.
Figure 27:
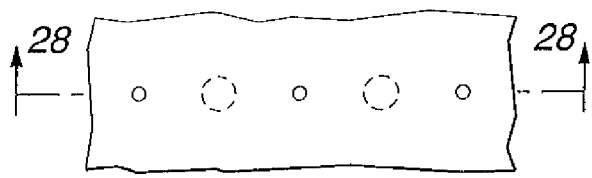
FIG. 27 is a plan view of an intermediate structure.
Figure 28:
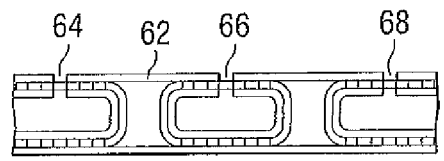
FIG. 28 is a cross-sectional view of the intermediate structure of FIG. 27, taken along line 28-28.

FIGS. 23 and 24 show that the substrate is again electroplated with a metal such as copper 60. However in this step, the copper only plates the exposed areas of the core. With the plating complete, a second layer of plating resist 62 is applied as shown in FIGS. 25 and 26. This layer of resist is patterned using known techniques to expose areas 64, 66 and 68 where blind vias or other raised structures are planned as shown in FIGS. 27 and 28.

Figure 29:
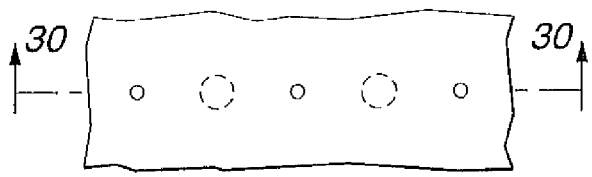
FIG. 29 is a plan view of an intermediate structure.
Figure 30:
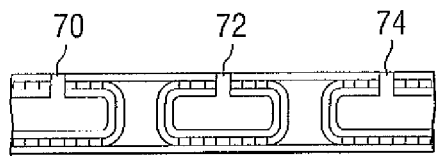
FIG. 30 is a cross-sectional view of the intermediate structure of FIG. 29, taken along line 30-30.
Figure 31:
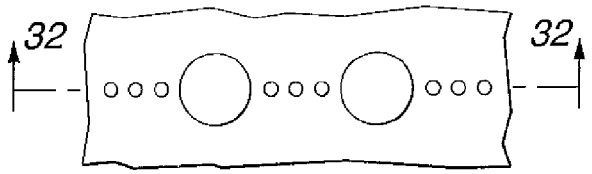
FIG. 31 is a plan view of an intermediate structure.
Figure 32:
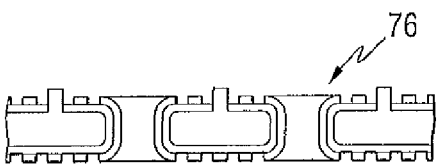
FIG. 32 is a cross-sectional view of the intermediate structure of FIG. 31, taken along line 32-32.

FIGS. 29 and 30 show that the substrate is electroplated with copper to make raised features 70, 72 and 74 such as solid via and blind via studs or posts. Once the plating is completed, all of the plating resist is removed from the substrate, leaving the structure 76 shown in FIGS. 31 and 32.

Figure 33:
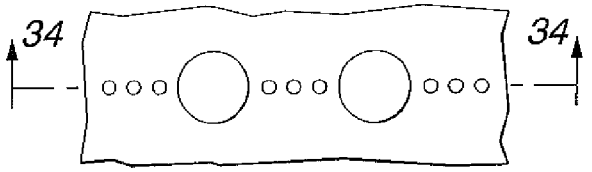
FIG. 33 is a plan view of a substrate.
Figure 34:
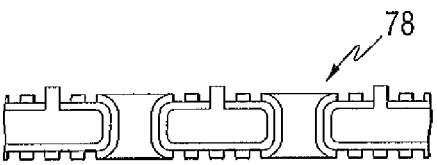
FIG. 34 is a cross-sectional view of the substrate of FIG. 33, taken along line 34-34.

The substrate is then subjected to a metal etchant that removes all of the thin metal in the areas that were not plated but only a fraction of the metal in the areas that were plated, leaving the structure 78 shown in FIG. 33. The substrate is etched in a way such that all of the "seed layer" of copper is removed. As a result, copper in other areas is etched as well. However, this only decreases the overall thickness and line width of the copper traces.

The process can be repeated multiple times to build lip additional layers of circuitry on the substrate. When completed, the substrate is ready for lamination with another substrate. The solid posts, studs or other features can serve as blind microvias, allowing for electrical connections through a dielectric layer. The posts could also be used for the positioning and anchoring of boards for lamination into multi-layer packages. Additionally, the posts, studs and other features can serve as thermal conductors, transferring heat from chips or other components to the exterior of the package.

In another aspect, the invention provides a method wherein after sputtering, a thin layer of copper is plated onto the dielectric material. Then a plating resist is applied, to plate tip the desired circuitry. Instead of stripping the plating resist off, another layer of plating resist is applied and posts are plated tip. These posts can be used for connecting through holes and for lamination anchors. Then all the plating resists are stripped off and the thin layer of copper on top of the dielectric material is etched off. This substrate is then ready for lamination with another similar substrate material.

More specifically, this aspect provides a technique for joining two or more circuit boards or packaging substrate layers together. To achieve this, one would plate solid vias or studs onto the circuitry to a height that is greater than the thickness of a laminate dielectric material that would be used to insulate the joining circuitry layers. The overall process would be as follows:

1) Apply an electrodepositable dielectric coating onto a conductive surface. Cure.
2) Sputter deposit an adhesion layer (such as chromium) and a seed layer (such as copper) to all surfaces of the dielectric material.
3) Apply a layer of plating resist to the sputtered substrate.
4) Pattern the resist.
5) Pattern plate copper, thus depositing copper to areas of the sputtered seed layer forming the to-be circuitry.
6) Apply a second layer of plating resist.
7) Pattern the second layer of resist to create openings in the resist. These openings can be on areas of the circuit and can be at the locations where an interconnect is desired between the two lamination layers.
8) Pattern plate copper, thus forming the solid studs.
9) Strip both layers of plating resist.
10) Remove the unplated seed layer.
11) Laminate substrates together with a layer of dielectric material between, thus forming the interconnection between the substrates.

Additional conductors or contacts can be formed by chemical, mechanical or laser ablating or using masking technologies to prevent the application of coatings at selected areas or to otherwise remove portions of the dielectric coating in a predetermined pattern to expose sections of the electrically conductive core. Then a layer of metal is applied to portions of the dielectric coating to form conductors and contacts. Metallization of at least one of the dielectric coating layers can also be used to form contacts and conductors adjacent to the surface of the dielectric coating layers.

Metallization typically is performed after the removal step by applying a layer of metal to all surfaces, allowing for the formation of metallized vias through the substrate (i.e., through vias) and/or to (but not through) the core (i.e., blind vias).

Alternatively, metallization can be performed prior to the removal step, with additional metallization performed afterward if necessary. The metal applied in this metallization step can be any of the previously mentioned metals or alloys provided that the metals or alloys have sufficient conductive properties. Typically, the metal applied in the above described metallization step is copper. The metal can be applied by conventional electroplating, seed electroplating, metal vapor deposition, or any other method providing a uniform metal layer as described above. The thickness of the metal layer is typically about 5 to 50 microns.

To enhance the adhesion of the metal layer to the dielectric coating prior to the metallization step, all surfaces can be treated with ion beam, electron beam, corona discharge or plasma bombardment, followed by the application of an adhesion promoter layer to all surfaces. The adhesion promoter layer can have a thickness ranging from 50 to 5000 Angstroms, and typically is a metal or metal oxide selected from chromium, titanium, nickel, cobalt, cesium, iron, aluminum, copper, gold, tungsten and zinc, and alloys and oxides thereof.

After metallization, a photosensitive layer (formed from a "photoresist" or "resist" composition) can be applied to the metal layer. Optionally, prior to application of the photosensitive layer, the metallized substrate can be cleaned and pretreated; e.g., treated with all acid etchant to remove oxidized metal. The photosensitive layer can be a positive or negative photosensitive layer. The photosensitive layer typically has a thickness of about 2 to 50 microns and can be applied by any method known to those skilled in the photolithographic processing art. Additive or subtractive processing methods may be used to create the desired circuit patterns.

After preparation of the circuit pattern on the substrate, other circuit components may be attached in one or more subsequent steps to form a circuit assembly. Additional components can include one or more multi-layer circuit assemblies prepared by any of the processes of the present invention, smaller scale components such as semiconductor chips, interposer layers, larger scale circuit cards or motherboards and active or passive components. Components may be attached using conventional adhesives, surface mount techniques, wire bonding or flip chip techniques.

It should be understood that any of the processes of the present invention can include one or more additional steps without departing from the scope of the invention. Likewise, the order in which the steps are performed may be changed as necessary, without departing from the scope of the invention.

As used in this description, unless indicated to the contrary, the numerical parameters are approximations that may vary depending upon the desired properties sought to be obtained. Thus each numerical parameter should at least be construed in light of the number of reported significant digits and by applying ordinary rounding techniques, or by taking typically manufacturing tolerances into account.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

While the invention has been described in terms of several examples, it will be apparent to those skilled in the art that various changes can be made to the described examples without departing from the scope of the invention as set forth in the following claims.

What is claimed is:

1. A method for coating an electrically conductive core, the method comprising:
coating an electrically conductive core with a first removable material;
creating openings in the first removable material to expose portions of the electrically conductive core;
plating a conductive material onto the exposed portions of the electrically conductive core;
coating the conductive material with a second removable material;
removing the first removable material;
electrophoretically coating the electrically conductive core with a dielectric coating; and
removing the second removable material.

2. The method of claim 1, wherein the first and second removable materials are removed using different chemistries.

3. The method of claim 1, wherein the first removable material comprises a negative-acting resist, and the second removable coating comprises a positive-acting resist.

4. The method of claim 1, wherein the first removable material comprises a positive-acting resist, and the second removable coating comprises a negative-acting resist.

5. The method of claim 1, wherein the dielectric coating is cured.

6. The method of claim 1, further comprising:
applying a conductive layer on all surfaces.

7. The method of claim 6, where the conductive layer is electrolessly applied.

8. The method of claim 7, where the conductive layer is further electroplated.

9. The method of claim 6, where the conductive layer is sputtered.

10. The method of claim 9, where the conductive layer is further electroplated.

11. A method for coating an electrically conductive core, the method comprising:
applying a layer of a first conductive material to a substrate having a dielectric coating on a conductive core and conductive vias extending through openings in the dielectric coating;
applying a layer of a first removable material to the first conductive material;
forming openings in the first removable material to expose areas of the conductive material to be plated;
plating a second conductive material onto the exposed areas of the first conductive material;
applying a layer of a second removable material to the first and second conductive material;
forming openings in the second removable material to expose areas of the second conductive material to be plated; and
plating a third conductive material onto the exposed areas of the second conductive material.

12. The method of claim 11, wherein of applying a layer of a first conductive material to a substrate comprises:
using electroless deposition to deposit a seed layer; and
plating the first conductive material onto the seed layer.

13. The method of claim 12, further comprising:
removing the first removable material; and
etching the seed layer.

14. The method of claim 11, wherein applying a layer of a first conductive material to a substrate comprises:
sputter depositing a seed layer; and
plating the first conductive material onto the seed layer.

15. The method of claim 14, further comprising:
removing the first removable material; and
etching the seed layer.

16. The method of claim 11, wherein the first and second removable materials are plating resists.

* * * * *